(12) United States Patent
Kawano

(10) Patent No.: US 7,477,179 B2
(45) Date of Patent: Jan. 13, 2009

(54) SUCCESSIVE APPROXIMATION A/D CONVERTER COMPARING ANALOG INPUT VOLTAGE TO REFERENCE VOLTAGES

(75) Inventor: Harumi Kawano, Miyazaki (JP)

(73) Assignee: Oki Semiconductor Co., Ltd. (JP)

( * ) Notice: Subject to any disclaimer, the term of this patent is extended or adjusted under 35 U.S.C. 154(b) by 0 days.

(21) Appl. No.: 11/730,623

(22) Filed: Apr. 3, 2007

(65) Prior Publication Data

US 2007/0229341 A1 Oct. 4, 2007

(30) Foreign Application Priority Data

Apr. 4, 2006 (JP) ............................. 2006-103335

(51) Int. Cl.
*H03M 1/38* (2006.01)
(52) U.S. Cl. ...................... 341/161; 341/155
(58) Field of Classification Search .......... 341/150–170
See application file for complete search history.

(56) References Cited

U.S. PATENT DOCUMENTS

| | | | | |
|---|---|---|---|---|
| 4,891,608 A | * | 1/1990 | Ikeda | ............................ 331/20 |
| 5,132,555 A | * | 7/1992 | Takahashi | .................... 326/102 |
| 5,633,637 A | * | 5/1997 | Noro | ........................... 341/118 |
| 5,736,951 A | | 4/1998 | Kobatake | |
| 5,929,847 A | * | 7/1999 | Yanagi et al. | ................. 345/204 |
| 6,310,616 B1 | * | 10/2001 | Yanagi et al. | ................. 345/211 |
| 6,329,879 B1 | * | 12/2001 | Maruyama et al. | ........... 330/289 |
| 6,404,274 B1 | * | 6/2002 | Hosono et al. | ............... 327/538 |
| 6,426,609 B2 | * | 7/2002 | Tanaka et al. | ................... 322/19 |
| 6,509,895 B2 | * | 1/2003 | Yanagi et al. | ................. 345/211 |
| 7,010,419 B2 | * | 3/2006 | Abe et al. | ..................... 701/111 |

* cited by examiner

*Primary Examiner*—Lam T Mai
(74) *Attorney, Agent, or Firm*—Studebaker & Brackett PC; Donald R. Studebaker

(57) ABSTRACT

An analog-to-digital converter includes a resistance type potential divider, connected between a supply voltage and a ground terminal, for generating plural reference voltages; and plural switches for selecting one of the reference voltages in response to a select signal. The analog-to-digital converter also includes a capacitor for storing an analog voltage applied to an input node and having its one plate connected to the input node and its other plate connected to the midpoint of the resistance type potential divider. The midpoint has an intermediate potential placed between the power supply voltage and the ground voltage, which is insensitive to noise transmitted from a logic circuit. It is thus possible to reduce the influence exerted by the noise transmitted from the logic circuit without newly providing the supply voltage and ground terminals to the analog-to-digital converter in order to connect the converter and the logic circuit independently to each other.

6 Claims, 3 Drawing Sheets

SUCCESSIVE APPROXIMATION A/D CONVERTER COMPARING ANALOG INPUT VOLTAGE TO REFERENCE VOLTAGES

BACKGROUND OF THE INVENTION

1. Field of the Invention

The present invention relates to an analog-to-digital (A/D) converter, more particularly to a successive approximation type of analog-to-digital converter implemented in such as a large scale integration (LSI) circuit.

2. Description of the Background Art

Reference will first be made to FIG. 2 for describing a conventional analog-to-digital converter for better understanding an analog-to-digital converter according to the present invention. FIG. 2 is a schematic block diagram showing part of an LSI circuit including a conventional analog-to-digital converter. In FIG. 2, the LSI circuit 100 includes an analog-to-digital converter 10 adapted to convert analog signals A into corresponding digital signals D; and a logic circuit 20 for performing logical operations in response to the digital signals D to output signals OUT. The analog-to-digital converter 10 and logic circuit 20 are connected to a common supply voltage terminal 1 and common ground terminal 2 and are driven by a supply voltage provided from the supply voltage terminal 1. Signals are designated with reference numerals designating connections on which they are conveyed.

The analog-to-digital converter 10 is of a successive approximation type where the voltage of the analog signals A is sampled and held such that the capacitor 12 stores corresponding electric charges, which are in turn compared sequentially with a reference voltage, which is sequentially switched, to output the digital signal D. The input analog signals A are supplied through a sampling switch 11 to an internal node NI. Between the internal node NI and a ground node NG, the capacitor 12 for storing the input voltage is connected. Further, between a power supply node NV and a ground node NG, a resistance type potential divider 13 for generating reference voltages is connected. In the resistance type potential divider 13, any one of the reference voltages output from the resistance type potential divider 13 is selected by switches 14 to be supplied to a comparison controller 15. From the comparison controller 15, signals for controlling on/off action of the switch 11 and selection behavior of switches 14 are output to the switches 11 and 14, respectively.

The comparison controller 15 is adapted to compare the reference voltage selected by one of the switches 14 and the voltage stored in the capacitor 12 and appearing at the internal node NI, and, depending on the result of comparison, to operate the controls of the switches 14 so as to render the one of the switches 14 turn on and off to produce the digital signal D, which corresponds to the analog input signal A.

In the analog-to-digital converter 10, one end of the resistance type potential divider 13 and a terminal of the comparison controller 15 on the side of the supply voltage are connected in common to the power supply node NV, which is also connected to the supply voltage terminal 1 of the LSI circuit 100 via a power supply connection 30. In the analog-to-digital converter 10 also, the other end of the resistance type potential divider 13 and a terminal of the comparison controller 15 on the side of the ground are connected in common to the ground node NG, which is also connected to the ground terminal 2 of the LSI circuit 100 via a ground connection 32.

In the logic circuit 20, one terminal on the side of the supply voltage is connected to the supply voltage terminal 1 of the LSI circuit 100 via a power supply connection 34 and the other terminal on the side of the ground is connected to the ground terminal 2 via a ground connection 36.

Such an analog-to-digital converter for converting analog signals into corresponding digital signals is disclosed, for example, by U.S. Pat. No. 5,736,951 A1 to Kobatake, in which a number of comparators are used for comparing an analog input voltage to each of different reference voltages to output digital values, and, with each comparator, a supply voltage terminal and ground terminal are connected, respectively, in order to protect the comparator from an error caused by noise.

In the conventional analog-to-digital converter 10, the capacitor 12 is, however, subject to switching noise generated in the logic circuit 20. More specifically, the logic circuit 20 generates very small switching noise during its operation, but the analog-to-digital converter 10 is converting the analog signals into the digital signals even when the logic circuit 20 is operating so that the noise is transmitted to the power supply node NV and the ground node NG through power supply connections 30, 34 and ground connections 32, 36, respectively.

The capacitor 12 has its one plate connected to the ground node NG, so that the transmitted switching noise varies the voltage of the internal node NI via the capacitor 12 thereby worsening the accuracy of the analog-to-digital converter.

One approach to solving this type of problem is to apply the method described in Kobatake, e.g. to use different supply voltage and ground terminals for the analog-to-digital converter 10 and logic circuit 20, respectively, so that they are connected to different supply voltage and ground terminals. This approach, however, increases the number of supply voltage terminal and ground terminal and also the number of external connector pins of the LSI circuit whereby a pattern of the wiring board of the LSI circuit grows very complicated.

SUMMARY OF THE INVENTION

It is therefore an object of the present invention to provide a successive approximation type of analog-to-digital converter of high accuracy with switching noise controlled without increasing the number of supply voltage terminal and ground terminal.

In accordance with the present invention, a successive approximation type of analog-to-digital converter includes a resistance type potential divider, connected between a supply voltage terminal and ground terminal, for generating a plurality of reference voltages; a plurality of switches for selecting one of the reference voltages in response to a select signal; a capacitor for storing an analog voltage applied to an input node and having its one plate connected to the input node and its other plate connected to the midpoint of the resistance type potential divider; and a comparison controller for performing a logic operation to generate the select signal to be supplied to the switches and compare sequentially the voltage stored in the capacitor and appearing at the input node with one of the reference voltage selected by the switches to output a digital value corresponding to the input analog voltage.

In accordance with the present invention, the other plate of the capacitor for storing an analog voltage applied to an input node is connected to the midpoint of the resistance type potential divider which is connected between supply voltage terminal and ground terminal to generate a plurality of reference voltages. The midpoint has an intermediate potential placed between the power supply voltage and the ground voltage, which is insensitive to noise transmitted from a logic circuit. It is thus possible to reduce the influence exerted by the noise transmitted from the logic circuit without newly providing the supply voltage terminal and ground terminal to the analog-to-digital converter in order to connect the analog-to-digital converter and the logic circuit independently to each other.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
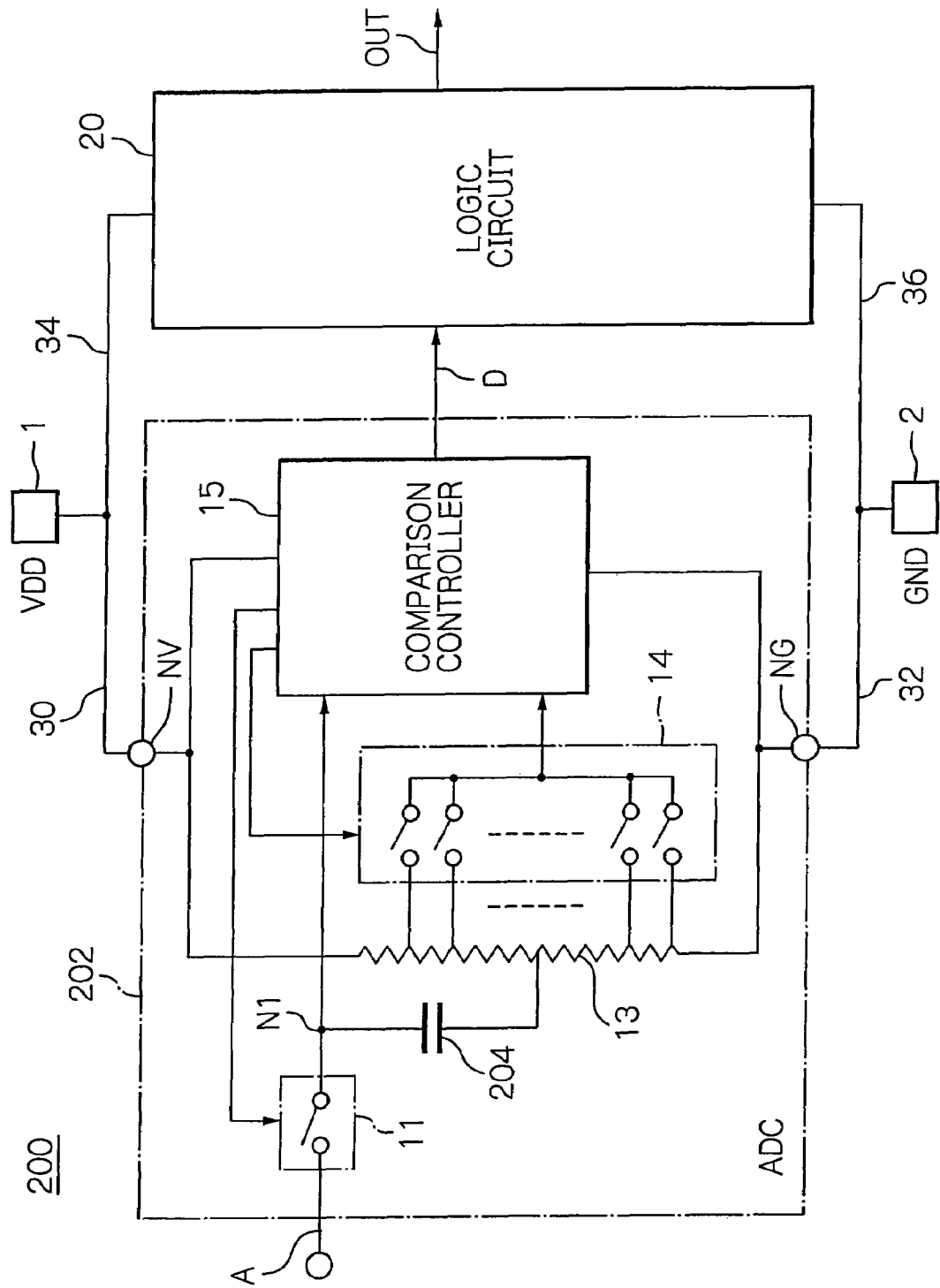
FIG. 1 is a schematic block diagram showing part of an LSI circuit including an embodiment of an analog-to-digital converter according to the present invention.
Figure 2:
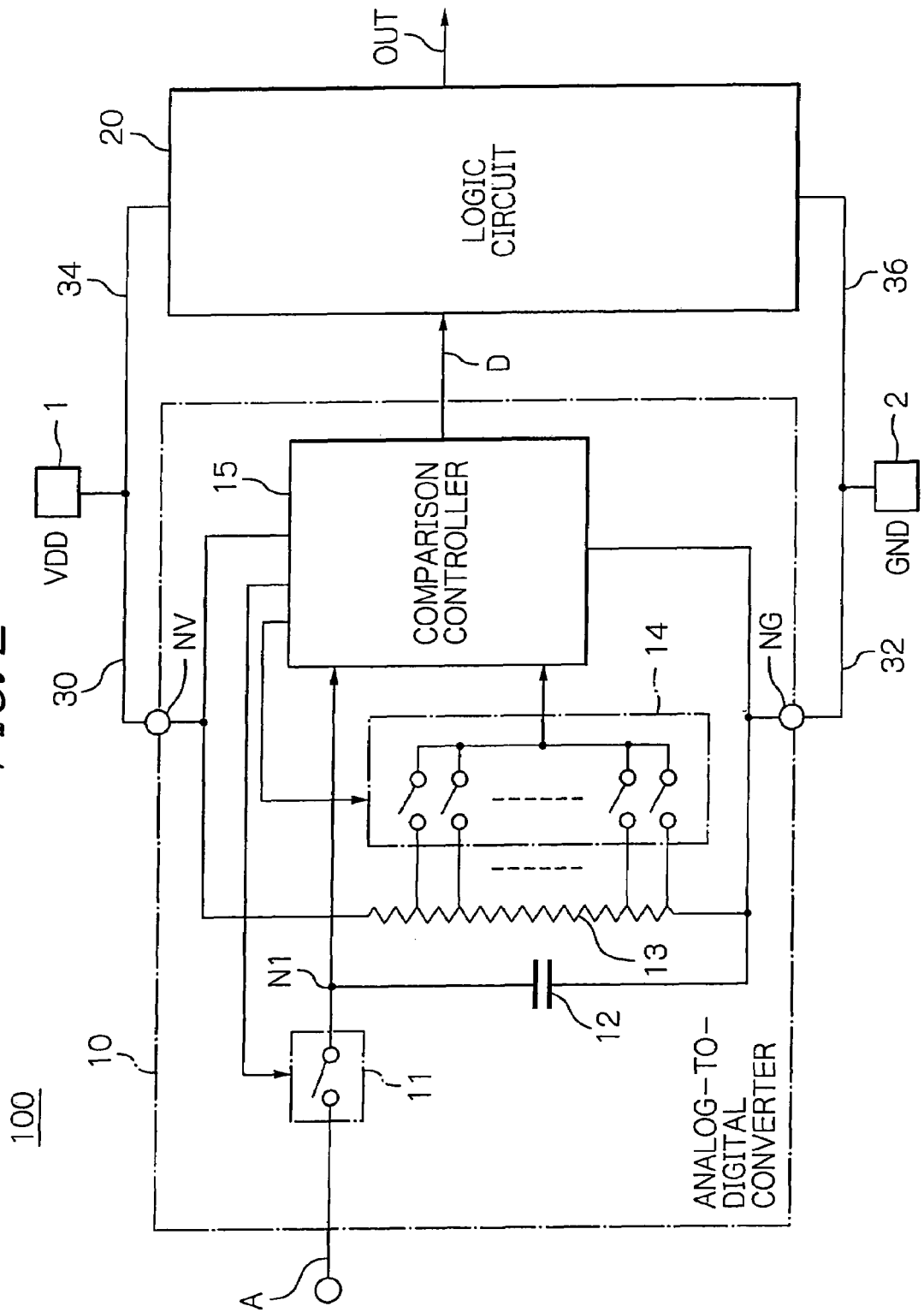
FIG. 2 is a schematic block diagram showing part of an LSI circuit including a conventional analog-to-digital converter to be compared with the analog-to-digital converter according to the present invention.

Next, with reference to the accompanying drawings, a preferred embodiment of the analog-to-digital converter according to the present invention will be described in detail. FIG. 1 is a schematic block diagram showing part of an LSI (Large Scale Integration) circuit including a preferred embodiment of the analog-to-digital converter according to the present invention. In FIG. 1, structural parts and elements like those shown in FIG. 2 are designated by identical reference numerals, and will not be described specifically in order to avoid redundancy.

The LSI circuit 200 comprises an analog-to-digital converter 202, labeled ADC in FIG. 1, for converting analog signals A to corresponding digital signals D. In response to the digital signals D, the logic circuit 20 performs logical operations to output signals OUT. The analog-to-digital converter 202 and logic circuit 20 are connected to the common supply voltage terminal 1 and common ground terminal 2, and are driven by the supply voltage VDD provided from the supply voltage terminal 1.

The analog-to-digital converter 202 is of a successive approximation type where the voltage of the analog signal A is sampled and held such that a capacitor 204 stores corresponding electric charges, which are in turn compared sequentially with a reference voltage, that is sequentially switched, to output the digital signal D. The input analog signals A are supplied through a sampling switch 11 to an internal node NI. The capacitor 204 for storing an input voltage has its one plate connected to the internal node NI and its other plate connected to the midpoint of the resistance type potential divider 13 which is arranged between the power supply node NV and ground node NG. Specifically, the capacitor 204 has its other plate connected to a connection point where a reference voltage is output which is substantially equal to half the voltage of the supply voltage VDD.

In the analog-to-digital converter 202, the resistance type potential divider 13 has its one end connected to the power supply node NV where the terminal of the comparison controller 15 on the side of the supply voltage is also connected. The resistance type potential divider 13 also has its other end connected to the ground node NG where the terminal of the comparison controller 15 on the side of the ground is also connected. The ground node NG is further connected to the ground terminal 2 via the ground connection 32.

A description will be overviewed below of the analog-to-digital conversion performed by the analog-to-digital converter 202 in the LSI circuit 200 in the illustrative embodiment.

First, during sampling and holding the voltage of an analog input signal A, the switch 11 is closed in response to a control signal supplied from the comparison controller 15 to have the capacitor 204 charging until a voltage on the internal node NI becomes equal to the voltage of the analog input signal A, and the switch is then closed thereby allowing the capacitor 204 to store the electric charge of the input voltage.

Next, one of the switches 14 is controlled by a control signal supplied from the comparison controller 15 to select one half of a full-scale reference voltage as a first reference voltage so that the voltage on the internal node NI is compared with the first reference voltage. If the voltage on the internal node NI is greater than the reference voltage, then the comparison controller 15 has one of the other switches 14 selecting three fourth of the full-scale reference voltage as a second reference voltage so that the voltage on the internal node NI is compared with the second reference voltage. In this manner, the comparison range of the reference voltage is lessened sequentially on halves by which a final voltage range including the voltage on the internal node NI is determined so that corresponding digital signal D is determined.

Simultaneously with the analog-to-digital conversion performed by the analog-to-digital converter 202, the logic circuit 20 performs logical operation. Because of the logical operation in the logic circuit 20, switching current flows from the supply voltage terminal 1 to the ground terminal 2 in the LSI circuit 200. The switching current produces a small amount of switching noises which are transmitted to the power supply node NV and ground node NG in the analog-to-digital converter 202 through the power supply connections 30, 34 and ground connections 32, 36, respectively.

Generally, however, it can be said that noises applied to the power supply node NV and ground node NG tend to be opposite in phase to each other because the larger amount of current has the lager voltage drop caused by wiring resistance so that the voltage on the power supply node NV decreases while the voltage on the ground node NG increases.

Consequently, at the midpoint of the resistance type potential divider 13, the influences exerted by each switching noises are cancelled out thereby the voltage on the midpoint of the resistance type potential divider 13 being kept substantially constant, which is arranged between the power supply node NV and ground node NG of the analog-to-digital converter 202, and also the voltage on the internal node NI being kept substantially constant, witch is connected via the capacitor 204 to the midpoint of the resistance type potential divider 13.

As described so far, in the analog-to-digital converter 202, the capacitor 204 for storing corresponding electric charges has its one plate connected to the midpoint of the resistance type potential divider 13 thereby the analog-to-digital converter 202 being advantageously insensitive to switching noise transmitted from the logic circuit 20 without forming the separate supply voltage and ground terminals for the capacitor 202.

Figure 3:
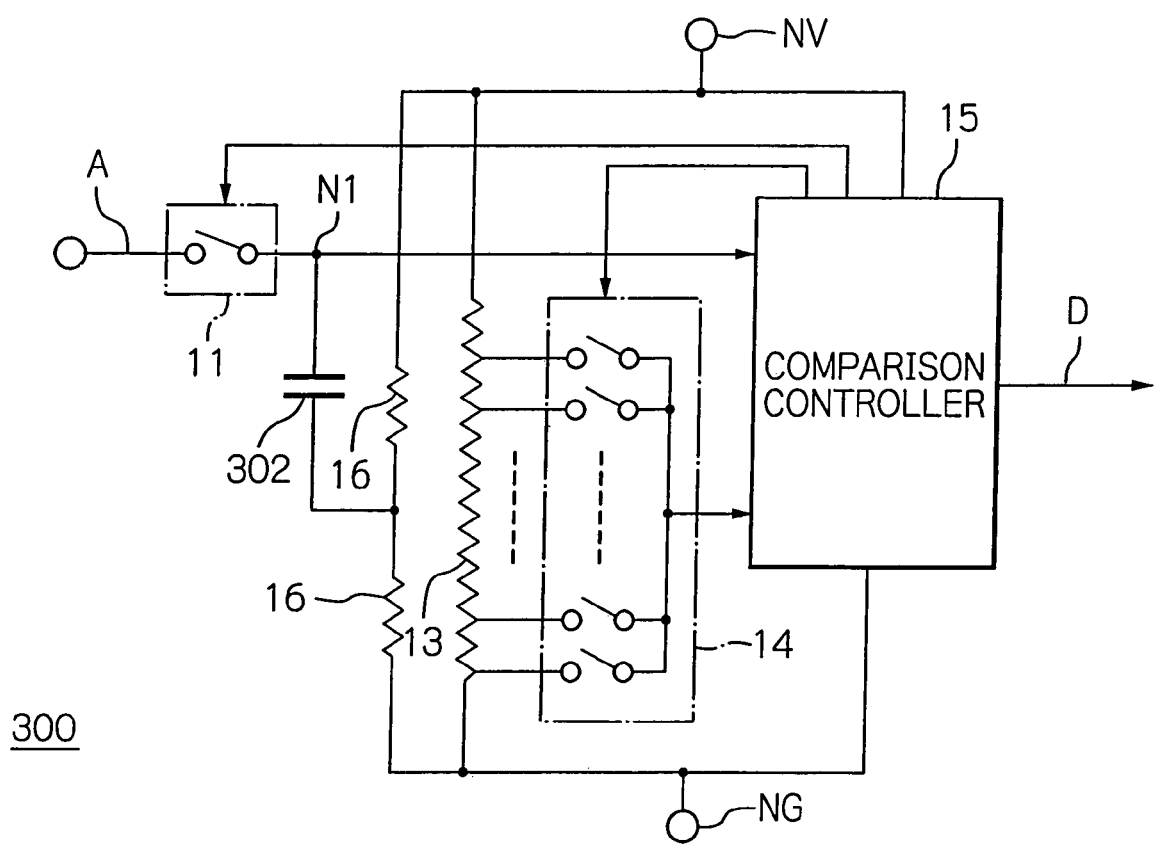
FIG. 3 is another schematic block diagram, like FIG. 1, showing an alternative embodiment of an analog-to-digital converter according to the present invention.

Reference will be made to FIG. 3 for describing an alternative, specific analog-to-digital converter according to the present invention. FIG. 3 is a schematic block diagram, like FIG. 1, showing an alternative embodiment of an analog-to-digital converter according to the present invention. In the figure, structural parts and elements like those shown in FIG.

1 are designated by identical reference numerals, and will not be described specifically in order to avoid redundancy.

In FIG. 3, an analog-to-digital converter 300 is of, like the analog-to-digital converter 202 shown in FIG. 1, a successive approximation type and also connected to the logic circuit 20 via power supply connections 30, 34 and ground connections 32, 36, which are not shown in FIG. 3. The analog-to-digital converter 300 includes resistance type potential dividers 16 for generating a midpoint potential between the power supply voltage VDD and the ground voltage GND as well as the resistance type potential divider 13 for generating a plurality of reference voltages. The resistance type potential dividers 16 have the total value of resistance set to be substantially two to three times as high as that of the resistance type potential divider 13, thereby preventing the power consumption from increasing. The analog-to-digital converter 300 also includes a capacitor 302 which is like the capacitor 204 shown in FIG. 1 and has its one plate connected to a midpoint located between the resistance type potential dividers 16.

The operation of the analog-to-digital converter 300 is like that of the analog-to-digital converter 202. The analog-to-digital converter 300, in addition to the advantage of the analog-to-digital converter 202, can be insensitive to switching noise caused by the switches 14 during switching between the reference voltages.

More specifically, since the analog-to-digital converter 300 includes the resistance type potential dividers 16 for generating a midpoint potential between the power supply voltage VDD and the ground voltage GND; and the capacitor 302 having its one plate connected to the midpoint located between the resistance type potential dividers 16, it is possible to control the influence exerted by the fluctuation of potential occurring at the midpoint of the resistance type potential divider 13 during switching between the reference voltages as well as the switching noise transmitted form the logic circuit 20.

The entire disclosure of Japanese patent application No. 2006-103335 filed on Apr. 4, 2006, including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What is claimed is:

1. An analog-to-digital converter comprising:
a resistance type potential divider, connected between a supply voltage terminal and a ground terminal, for generating a plurality of reference voltages;
a plurality of switches for selecting one of the reference voltages in response to a select signal;
a capacitor for storing an analog voltage applied to an input node and having one plate connected to the input node and another plate connected to a midpoint of said resistance type potential divider; and
a comparison controller for performing a logic operation to generate the select signal to be supplied to said switches and compare sequentially the voltage stored in said capacitor and appearing at the input node with one of the reference voltage selected by said switches to output a digital value corresponding to the input analog voltage.

2. The analog-to-digital converter in accordance with claim 1, further comprising a logic circuit connected to the supply voltage terminal and the ground terminal to be driven by the supply voltage provided from the supply voltage terminal.

3. The analog-to-digital converter in accordance with claim 1, wherein said analog-to-digital converter is of a successive approximation type.

4. An analog-to-digital converter comprising:
a first resistance type potential divider, connected between a supply voltage terminal and a ground terminal, for generating a plurality of reference voltages;
a plurality of switches for selecting one of the reference voltages in response to a select signal;
a second resistance type potential divider arranged between the supply voltage terminal and the ground terminal such that a midpoint of said second resistance type potential divider outputs an intermediate voltage located between the supply voltage and the ground voltage;
a capacitor for storing an analog voltage applied to an input node and having one plate connected to the input node and another plate connected to the midpoint of said second resistance type potential divider; and
a comparison controller for performing a logic operation to generate the select signal to be supplied to said switches and compare sequentially the voltage stored in said capacitor and appearing at the input node with one of the reference voltage selected by said switches to output a digital value corresponding to the input analog voltage.

5. The analog-to-digital converter in accordance with claim 4, further comprising a logic circuit connected to the supply voltage terminal and the ground terminal to be driven by the supply voltage provided from the supply voltage terminal.

6. The analog-to-digital converter in accordance with claim 4, wherein said analog-to-digital converter is of a successive approximation type.

* * * * *